(12) United States Patent
Jo et al.

(10) Patent No.: US 10,653,003 B2
(45) Date of Patent: May 12, 2020

(54) FLEXIBLE CIRCUIT BOARD WITH IMPROVED BONDING FLATNESS

(71) Applicant: GigaLane Co., Ltd., Hwaseong-si, Gyeonggi-do (KR)

(72) Inventors: Byung Hoon Jo, Hwaseong-si (KR); Sang Pil Kim, Hwaseong-si (KR); Byung Yeol Kim, Hwaseong-si (KR); Hee seok Jung, Hwaseong-si (KR)

(73) Assignee: GIGALANE CO., LTD., Hwaseong-si, Gyeonggi-Do (KR)

( * ) Notice: Subject to any disclaimer, the term of this patent is extended or adjusted under 35 U.S.C. 154(b) by 0 days.

(21) Appl. No.: 16/224,967

(22) Filed: Dec. 19, 2018

(65) Prior Publication Data

US 2019/0230787 A1  Jul. 25, 2019

(30) Foreign Application Priority Data

Jan. 25, 2018 (KR) .................. 10-2018-0009431

(51) Int. Cl.
*H05K 1/02* (2006.01)
*H05K 1/14* (2006.01)
*H05K 1/18* (2006.01)

(52) U.S. Cl.
CPC ........... *H05K 1/0271* (2013.01); *H05K 1/028* (2013.01); *H05K 1/0237* (2013.01);
(Continued)

(58) Field of Classification Search
CPC ............. G03F 7/70708; H01L 21/6838; H01L 23/563; H01L 2224/75743; H05K 1/0271; H05K 1/028; H05K 2203/0195; H05K 2203/082; H05K 2201/2036; H05K 2201/0715; H05K 2201/0723; H05K 2201/09045; H05K 2201/09063; H05K 2201/0191; H05K 2201/0989; H05K 2201/0364; H05K 3/28; H05K 3/3452; H05K 3/36; H05K 3/361; H05K 3/363; H05K 1/0266; H05K 1/111; H05K 1/025; H05K 1/0253; H05K 1/024; H05K 1/0227; H05K 1/0221; H05K 2201/09136; H05K 2201/2009; H05K 2201/2018;
(Continued)

(56) References Cited

U.S. PATENT DOCUMENTS 3,833,230 A * 9/1974 Noll ...................... B23B 31/307
279/3
5,029,383 A * 7/1991 Snyder ............... H05K 13/0409
29/740

(Continued)

FOREIGN PATENT DOCUMENTS

JP   2009246070 A   10/2009
JP   2014175423 A   9/2014
(Continued)

*Primary Examiner* — Roshin K Varghese
(74) *Attorney, Agent, or Firm* — Brundidge & Stanger, P.C.

(57) ABSTRACT

In one example, a flexible circuit board includes a signal line disposed between a first ground and a second ground; a dielectric disposed between the first ground and the signal line and between the second ground and the signal line; and a flatness improvement portion disposed on an upper portion of the second ground.

9 Claims, 4 Drawing Sheets

(52) U.S. Cl.
CPC ............. *H05K 1/0281* (2013.01); *H05K 1/14* (2013.01); *H05K 1/189* (2013.01); *H05K 2201/09327* (2013.01); *H05K 2201/2009* (2013.01)

(58) Field of Classification Search
CPC ... H05K 2201/2045; H05K 2203/0169; H05K 1/0281; H01P 3/08; H01P 3/082; H01P 3/084; H01P 3/085; H01P 3/087; H01P 3/088
See application file for complete search history.

(56) References Cited

U.S. PATENT DOCUMENTS

| | | | | |
|---|---|---|---|---|
| 5,284,287 A | * | 2/1994 | Wilson | H01L 21/4853 228/180.22 |
| 6,426,468 B1 | * | 7/2002 | Utsunomiya | H01L 23/49838 174/255 |
| 9,706,640 B2 | * | 7/2017 | Ho | H05K 1/024 |
| 2006/0130767 A1 | * | 6/2006 | Herchen | G03B 27/32 118/728 |
| 2008/0078573 A1 | * | 4/2008 | Hu | H05K 1/0219 174/262 |
| 2008/0179079 A1 | * | 7/2008 | Ishii | H05K 1/028 174/254 |
| 2009/0134530 A1 | * | 5/2009 | Kurihara | H01L 23/49833 257/784 |
| 2009/0291531 A1 | * | 11/2009 | Sato | H01L 21/4878 438/126 |
| 2010/0290159 A1 | * | 11/2010 | Chou | G11B 5/455 360/245 |
| 2011/0067904 A1 | * | 3/2011 | Aoyama | H05K 3/4069 174/254 |
| 2011/0230146 A1 | * | 9/2011 | Morishita | H01Q 1/243 455/77 |
| 2015/0087353 A1 | * | 3/2015 | Yosui | H01P 3/085 455/550.1 |
| 2015/0091676 A1 | * | 4/2015 | Kato | H01R 12/62 333/246 |
| 2016/0071807 A1 | * | 3/2016 | Hsu | H01L 23/562 361/768 |

FOREIGN PATENT DOCUMENTS

| | | |
|---|---|---|
| KR | 1020080031713 A | 4/2008 |
| KR | 1020090061438 A | 6/2009 |
| KR | 200456877 Y1 | 11/2011 |
| KR | 101812317 B1 | 12/2017 |
| WO | 2013099609 A1 | 7/2013 |
| WO | 2017199930 A1 | 11/2017 |

\* cited by examiner

FLEXIBLE CIRCUIT BOARD WITH IMPROVED BONDING FLATNESS

CROSS-REFERENCE TO RELATED APPLICATION

This application claims the benefit under 35 U.S.C. § 119 of a Korean patent application No. 10-2018-0009431 filed on Jan. 25, 2018 in the Korean Intellectual Property Office, the entire disclosure of which is hereby incorporated herein by reference.

TECHNICAL FIELD

The embodiments described herein pertain generally to a flexible circuit board.

BACKGROUND

Recently, a flexible circuit board has gradually replaced a coaxial cable, which has been used for the purpose of transmitting a high frequency signal as a component of wireless terminals such as a smartphone and a tablet personal computer (PC).

In addition, surface mounter technology (SMT) has been used as a method of bonding the flexible circuit board to a printed circuit board.

As shown in FIG. 1, according to the SMT, a mounter 30 adsorbs and mounts a flexible circuit board 10 on a printed circuit board 20, and the flexible circuit board 10 and the printed circuit board 20 are coupled by thermally melting solder 22 between a flexible circuit board ground pad 11 formed below the flexible circuit board 10 and a printed circuit board ground pad 21 formed on the printed circuit board 20.

However, since the flexible circuit board 10 is bent by the mounter 30 or heat, flatness of bonding with the printed circuit board 20 is lowered. Thus, the SMT is not properly performed.

SUMMARY

The present invention has been made to solve the above-mentioned conventional problems and is directed to providing a flexible circuit board with improved bonding flatness.

In one example embodiment, a flexible circuit board with improved flatness includes: a signal line disposed between a first ground and a second ground; a dielectric disposed between the first ground and the signal line and between the second ground and the signal line; and a flatness improvement portion disposed on an upper portion of the second ground.

A protrusion may be formed on the flatness improvement portion

A diameter of the protrusion may be greater than a diameter of a suctioning port of a mounter so that the protrusion is partially inserted into the suctioning port.

A tray configured to accommodate the flexible circuit board with improved flatness may be provided, wherein an inclined surface may be formed outside a section of the tray, into which the flexible circuit board is inserted.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
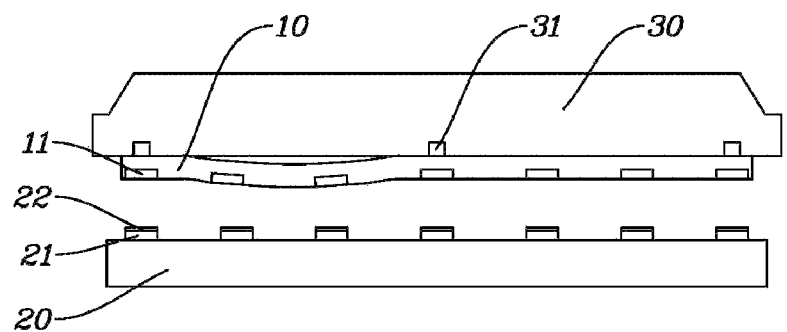
FIG. 1 is a view illustrating a problem of the related art.
Figure 2:
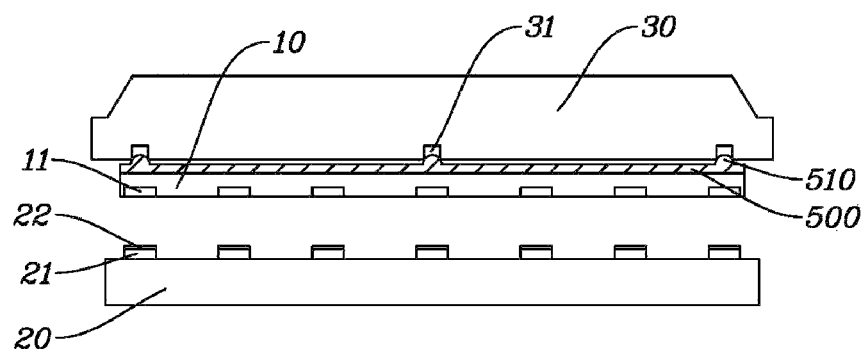
FIG. 2 is a view illustrating a flexible circuit board that is mounted on a printed circuit board by a mounter.
Figure 3:
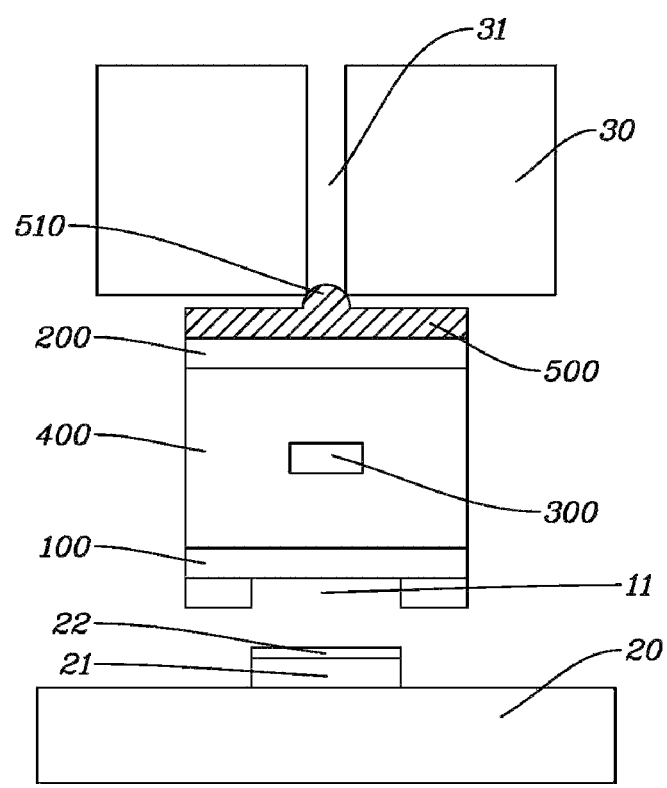
FIG. 3 is a view illustrating a protrusion.

In order to solve a problem in that surface mounter technology (SMT) is not properly performed because flatness of bonding with a printed circuit board 20 is lowered due to a flexible circuit board 10 being bent by a mounter 30 or heat, as shown in FIGS. 2 and 3, the present invention includes a first ground 100, a second ground 200, a signal line 300, a dielectric 400, and a flatness improvement portion 500.

The signal line 300 is disposed between the first ground 100 and the second ground 200.

The dielectric 400 is disposed between the first ground 100 and the signal line 300 and between the second ground 200 and the signal line 300.

The flatness improvement portion 500 is disposed on an upper portion of the second ground 200.

The flatness improvement portion 500 may be made of any one selected from a photo-imageable solder resist (PSR), a preimpregnated material (Prepreg), and a metal.

When the flatness improvement portion 500 is made of a metal, the metal may be stainless steel having high corrosion resistance.

The sum of thicknesses of the flatness improvement portion 500 and the second ground 200 may be greater than a thickness of the first ground 100.

For example, the first ground 100 and the second ground 200 may each have a thickness of 35 μm, and the flatness improvement portion 500 may have a thickness of 20 μm or more.

The flatness improvement portion 500 may be formed on an entire upper portion of the flexible circuit board 10 or a portion of the upper portion of the flexible circuit board 10 including a portion with which the mounter 30 comes into contact.

When the mounter 30 comes into contact with the flatness improvement portion 500, the flexible circuit board 10 is adsorbed in a flat state without being bent. The flexible circuit board 10 in the flat state is mounted on the printed circuit board 20. Thus, bonding flatness of the flexible circuit board 10 is improved.

In addition, the flatness improvement portion 500 reduces conduction of heat to the flexible circuit board 10 and functions as a frame to prevent the flexible circuit board 10 from being bent by heat.

As described above, the flatness improvement portion 500 prevents the flexible circuit board 10 from being bent, thereby improving bonding flatness of the flexible circuit board 10.

As shown in FIG. 3, a protrusion 510 corresponding to a suctioning port 31 of the mounter 30 may be formed on the flatness improvement portion 500.

When the flatness improvement portion 500 is made of a PSR, the protrusion 510 may be formed on the second ground 200. The PSR may protrude along a shape of the protrusion 510 to form the protrusion 510.

When the flatness improvement portion 500 is made of a Prepreg or a metal, the flatness improvement portion 500 including the protrusion 510 formed therein may be attached to the upper portion of the second ground 200.

Since the suctioning port 31 indirectly adsorbs the flexible circuit board 10 through the protrusion 510 by inserting the protrusion 510 into the suctioning port 31, the mounter 30 may adsorb the flexible circuit board 10 in a flat state.

A diameter of the protrusion 510 may be equal to a diameter of the suctioning port 31 so that the protrusion 510 may be entirely inserted into the suctioning port 31. Alternatively, the diameter of the protrusion 510 may be greater than the diameter of the suctioning port 31 so that the protrusion 510 may be partially inserted into the suctioning port 31.

Figure 4:
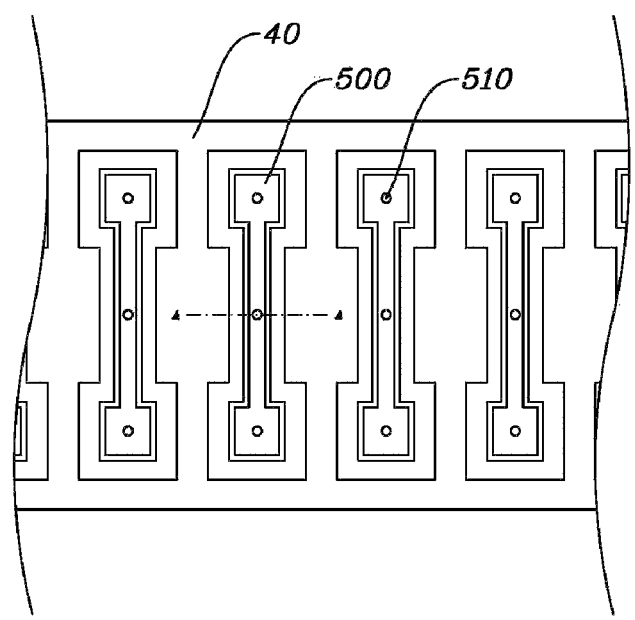
FIG. 4 is a view illustrating a shape in which a flexible circuit board is accommodated in a tray.

As shown in FIG. 4, in order for the protrusion 510 to be accurately inserted into the suctioning port 31, an inclined surface 41 may be formed outside a section of a tray 40 including the flexible circuit board 10 before the mounter 30 adsorbs the flexible circuit board 10, wherein the flexible circuit board 10 is inserted into the section.

Figure 5A:
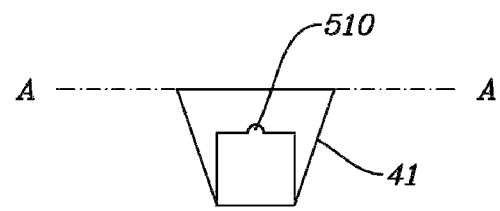
FIGS. 5A and 5B are a set of views illustrating a cross-sectional shape of a tray.
Figure 5B:
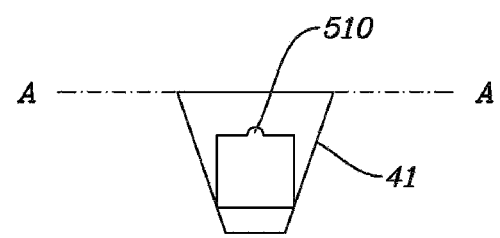

A minimum width of the inclined surface 41 may be equal to a width of the flexible circuit board 10 as shown in FIG. 5A or may be smaller than the width of the flexible circuit board 10 as shown in FIG. 5B.

As described above, the flexible circuit board 10 is indirectly adsorbed to the mounter 30 by the protrusion 510, thereby improving bonding flatness of the flexible circuit board 10.

In addition, the inclined surface 41 allows the protrusion 510 to be accurately inserted into the suctioning port 31, thereby improving bonding flatness of the flexible circuit board 10.

As described above, the bonding position is aligned due to the shape of the printed circuit board ground pad 21.

In order to solve a problem in that surface mounter technology (SMT) is not properly performed because flatness of bonding with a printed circuit board 20 is lowered due to a flexible circuit board 10 being bent by a mounter 30 or heat, as shown in FIGS. 2 and 3, the present invention includes a first ground 100, a second ground 200, a signal line 300, a dielectric 400, and a flatness improvement portion 500.

The signal line 300 is disposed between the first ground 100 and the second ground 200.

The dielectric 400 is disposed between the first ground 100 and the signal line 300 and between the second ground 200 and the signal line 300.

The flatness improvement portion 500 is disposed on an upper portion of the second ground 200.

The flatness improvement portion 500 may be made of any one selected from a photo-imageable solder resist (PSR), a preimpregnated material (Prepreg), and a metal.

When the flatness improvement portion 500 is made of a metal, the metal may be stainless steel having high corrosion resistance.

The sum of thicknesses of the flatness improvement portion 500 and the second ground 200 may be greater than a thickness of the first ground 100.

For example, the first ground 100 and the second ground 200 may each have a thickness of 35 μm, and the flatness improvement portion 500 may have a thickness of 20 μm or more.

The flatness improvement portion 500 may be formed on an entire upper portion of the flexible circuit board 10 or a portion of the upper portion of the flexible circuit board 10 including a portion with which the mounter 30 comes into contact.

When the mounter 30 comes into contact with the flatness improvement portion 500, the flexible circuit board 10 is adsorbed in a flat state without being bent. The flexible circuit board 10 in the flat state is mounted on the printed circuit board 20. Thus, bonding flatness of the flexible circuit board 10 is improved.

In addition, the flatness improvement portion 500 reduces conduction of heat to the flexible circuit board 10 and functions as a frame to prevent the flexible circuit board 10 from being bent by heat.

As described above, the flatness improvement portion 500 prevents the flexible circuit board 10 from being bent, thereby improving bonding flatness of the flexible circuit board 10.

As shown in FIG. 3, a protrusion 510 corresponding to a suctioning port 31 of the mounter 30 may be formed on the flatness improvement portion 500.

When the flatness improvement portion 500 is made of a PSR, the protrusion 510 may be formed on the second ground 200. The PSR may protrude along a shape of the protrusion 510 to form the protrusion 510.

When the flatness improvement portion 500 is made of a Prepreg or a metal, the flatness improvement portion 500 including the protrusion 510 formed therein may be attached to the upper portion of the second ground 200.

Since the suctioning port 31 indirectly adsorbs the flexible circuit board 10 through the protrusion 510 by inserting the protrusion 510 into the suctioning port 31, the mounter 30 may adsorb the flexible circuit board 10 in a flat state.

A diameter of the protrusion 510 may be equal to a diameter of the suctioning port 31 so that the protrusion 510 may be entirely inserted into the suctioning port 31. Alternatively, the diameter of the protrusion 510 may be greater than the diameter of the suctioning port 31 so that the protrusion 510 may be partially inserted into the suctioning port 31.

As shown in FIG. 4, in order for the protrusion 510 to be accurately inserted into the suctioning port 31, an inclined surface 41 may be formed outside a section of a tray 40 including the flexible circuit board 10 before the mounter 30 adsorbs the flexible circuit board 10, wherein the flexible circuit board 10 is inserted into the section.

A minimum width of the inclined surface 41 may be equal to a width of the flexible circuit board 10 as shown in FIG. 5A or may be smaller than the width of the flexible circuit board 10 as shown in FIG. 5B.

As described above, the flexible circuit board 10 is indirectly adsorbed to the mounter 30 by the protrusion 510, thereby improving bonding flatness of the flexible circuit board 10.

In addition, the inclined surface 41 allows the protrusion 510 to be accurately inserted into the suctioning port 31, thereby improving bonding flatness of the flexible circuit board 10.

DESCRIPTION OF REFERENCE NUMERALS

| | |
|---|---|
| 10: flexible circuit board | 11: flexible circuit board ground pad |
| 20: printed circuit board | 21: printed circuit board ground pad |
| 30: mounter | 31: suctioning port |
| 40: tray | 41: inclined surface |
| 100: first ground | 200: second ground |

| DESCRIPTION OF REFERENCE NUMERALS | |
|---|---|
| 300: signal line | 400: dielectric |
| 500: flatness improvement portion | 510: protrusion |

We claim:

1. A flexible circuit board having flatness, comprising:
   a signal line vertically disposed between a first ground and a second ground;
   a dielectric disposed between the first ground and the signal line and between the second ground and the signal line; and
   a frame layer directly attached to the second ground,
      wherein the frame layer prevents the flexible circuit board from being bent by a mounter,
      wherein a protrusion is formed on the frame layer, and the protrusion and the frame layer are made of the same material,
      wherein the protrusion has a hemispherical shape and protrudes away from the signal line, and
      wherein a diameter of the protrusion is greater than a diameter of a suctioning port of the mounter so that the protrusion is to be partially inserted into the suctioning port of the mounter when the mounter picks up the flexible circuit board.

2. The flexible circuit board of claim 1,
   wherein the flexible circuit board is provided in a tray, and
   wherein the tray includes a planar bottom and an inclined side wall which extends from the planar bottom of the tray.

3. The flexible circuit board of claim 1, wherein the frame layer is made of a photo-imageable solder resist (PSR), a preimpregnated material (Prepreg), or a metal.

4. The flexible circuit board of claim 1, wherein a sum of a thickness of the frame layer and a thickness of the second ground is greater than a thickness of the first ground.

5. The flexible circuit board of claim 1, wherein the frame layer is formed on an entire upper portion of the flexible circuit board.

6. The flexible circuit board of claim 1, wherein the frame layer is formed on a portion of an upper portion of the flexible circuit board including a portion with which the mounter comes into contact.

7. A flexible circuit board having flatness, comprising:
   a signal line vertically disposed between a first ground and a second ground;
   a dielectric disposed between the first ground and the signal line and between the second ground and the signal line; and
   a frame layer directly attached to the second ground,
      wherein the frame layer prevents the flexible circuit board from being bent by heat,
      wherein a protrusion is formed on the frame layer, and the protrusion and the frame layer are made of the same material,
      wherein the protrusion has a hemispherical shape and protrudes away from the signal line, and
      wherein a diameter of the protrusion is greater than a diameter of a suctioning port of a mounter so that the protrusion is to be partially inserted into the suctioning port of the mounter when the mounter picks up the flexible circuit board.

8. The flexible circuit board of claim 1, wherein the frame layer and the protrusion are made of a metal.

9. A flexible circuit board having flatness, comprising:
   a signal line vertically disposed between a first ground and a second ground;
   a dielectric disposed between the first ground and the signal line and between the second ground and the signal line; and
   a frame layer directly attached to the second ground,
      wherein the frame layer prevents the flexible circuit board from being bent by a mounter or heat,
      wherein a protrusion is formed on the frame layer, and the protrusion and the frame layer are made of the same material,
      wherein the protrusion has a hemispherical shape and protrudes away from the signal line,
      wherein the flexible circuit board is provided in a tray, and
      wherein the tray includes a planar bottom and an inclined side wall which extends from the planar bottom of the tray.

* * * * *